(12) United States Patent
Kim et al.

(10) Patent No.: US 9,837,166 B2
(45) Date of Patent: Dec. 5, 2017

(54) DATA STORAGE DEVICE AND OPERATING METHOD THEREOF

(71) Applicant: SK hynix Inc., Gyeonggi-do (KR)

(72) Inventors: Hyun Jun Kim, Gyeonggi-do (JP);
Byeong Gyu Park, Gyeonggi-do (JP);
Joong Seob Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/186,216

(22) Filed: Jun. 17, 2016

(65) Prior Publication Data

US 2017/0271024 A1     Sep. 21, 2017

(30) Foreign Application Priority Data

Mar. 21, 2016   (KR) ........................ 10-2016-0033347

(51) Int. Cl.
*G11C 16/10* (2006.01)
*G11C 16/34* (2006.01)
*G11C 16/08* (2006.01)
*G11C 29/42* (2006.01)

(52) U.S. Cl.
CPC ............ *G11C 16/349* (2013.01); *G11C 16/08* (2013.01); *G11C 16/10* (2013.01); *G11C 29/42* (2013.01)

(58) Field of Classification Search
CPC ..... G11C 16/10; G11C 16/0483; G11C 16/26; G11C 11/5628; G11C 16/16
USPC ..................................................... 365/185.12
See application file for complete search history.

(56) References Cited

U.S. PATENT DOCUMENTS

| 6,851,015 B2 * | 2/2005 | Akahane ............ G11C 16/105 365/228 |
| 2007/0277076 A1 * | 11/2007 | Tamura ............... G06F 11/1068 714/752 |

FOREIGN PATENT DOCUMENTS

| KR | 1020020092487 | 12/2002 |
| KR | 1020070038072 | 4/2007 |

* cited by examiner

*Primary Examiner* — Hoai V Ho
*Assistant Examiner* — Minh Dinh
(74) *Attorney, Agent, or Firm* — IP & T Group LLP (57) ABSTRACT

A data storage device includes a controller configured to control data to be written in a first page; and a nonvolatile memory device configured to perform a write operation for writing the data, according to whether the first page is written or not, wherein the nonvolatile memory device provides a state information including an overwrite information meaning whether the write operation has caused an overwrite, to the controller.

14 Claims, 10 Drawing Sheets

DATA STORAGE DEVICE AND OPERATING METHOD THEREOF

CROSS-REFERENCES TO RELATED APPLICATION

The present application claims priority under 35 U.S.C. §119(a) to Korean application number 10-2016-0033347, filed on Mar. 21, 2016, in the Korean Intellectual Property Office, which is incorporated herein by reference in its entirety.

BACKGROUND

1. Technical Field

Various embodiments of the present invention generally relate to a data storage device including a nonvolatile memory device as a storage medium.

2. Related Art

Recently, the paradigm for the computer environment has shifted into ubiquitous computing where computer systems can be used anytime and anywhere. Due to this, use of portable electronic devices such as mobile phones, digital cameras, and notebook computers has rapidly increased. In general, such portable electronic devices use a data storage device which uses a semiconductor memory device (memory device) for storing data to be used in the portable electronic device.

A data storage device using a memory device provides advantages in that, since there is no mechanical driving part, stability and durability are excellent, information access speed is high and power consumption is small. Data storage devices having such advantages include, for example, a universal serial bus (USB) memory device, memory cards having various interfaces, a universal flash storage (UFS) device, and a solid state drive (SSD).

SUMMARY

Various embodiments are directed to a data storage device including a nonvolatile memory device that is capable of processing an unintentional overwrite operation.

In an embodiment, a data storage device may include: a controller configured to control data to be written in a first page; and a nonvolatile memory device configured to perform a write operation for writing the data, according to whether the first page is written or not, wherein the nonvolatile memory device provides a state information including an overwrite information meaning whether the write operation has caused an overwrite, to the controller.

In an embodiment, there may be provided a method for operating a data storage device including a controller and a nonvolatile memory device which operates according to control of the controller, wherein the controller may control the nonvolatile memory device such that data is written in a first page, wherein the nonvolatile memory device may perform a write operation for writing the data, according to whether the first page is written or not, wherein the controller may control the nonvolatile memory device to provide a state information including a result of the write operation, and wherein the nonvolatile memory device may provide the state information including an overwrite information meaning whether the write operation has caused an overwrite, to the controller.

According to the embodiments, even though an unintentional overwrite operation is requested by a controller, a nonvolatile memory device may process the unintentional overwrite operation and provide a processing result to the controller.

DETAILED DESCRIPTION

In the present invention, advantages, features and methods for achieving them will become more apparent after a reading of the following embodiments taken in conjunction with the drawings. The present invention may, however, be embodied in different forms and should not be construed as being limited to the embodiments set forth herein. Rather, these embodiments are provided for describing the present invention in sufficient detail to enable a person skilled in the art to which the invention pertains to practice the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise.

It will be further understood that the terms "comprises", "comprising", "Includes", and "including" when used in this specification, specify the presence of the stated elements and do not preclude the presence or addition of one or more other elements.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention including a data storage device and an operating method thereof will be described below with reference to the accompanying drawings.

Figure 1:
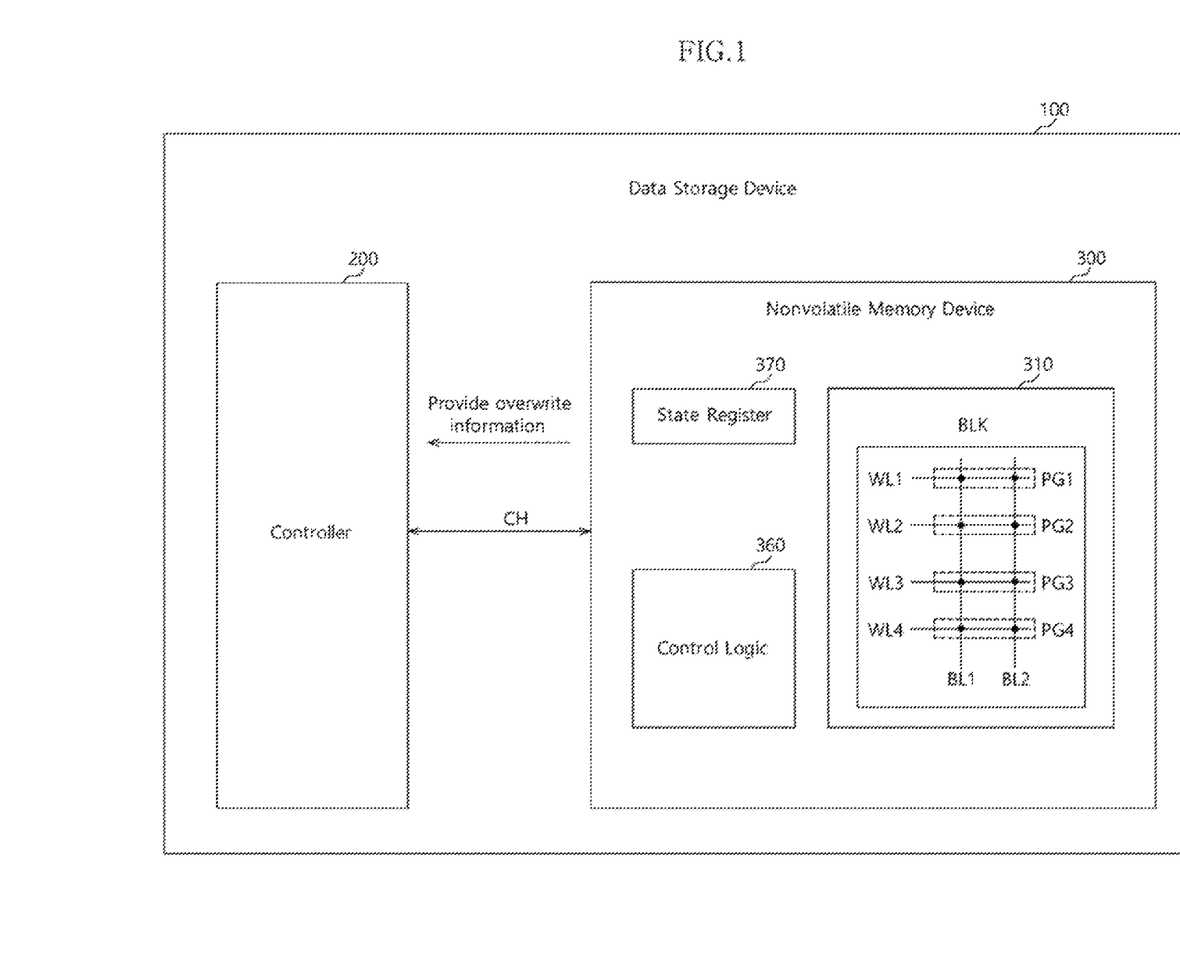
FIG. 1 is a block diagram illustrating a data storage device, according to an embodiment of the present invention

Referring now to FIG. 1 a data storage device 100 is provided, according to an embodiment of the present invention. The data storage device 100 may store data to be accessed by a host device (not shown), such as, for example, a mobile phone, an MP3 player, a laptop computer, a desktop computer, a game player, a TV, an in-vehicle infotainment system, and so forth. The data storage device 100 may also be referred to as a memory system.

The data storage device 100 may be manufactured as any one of various storage devices according to the protocol of an interface which is coupled electrically with the host device. For example, the data storage device 100 may be configured as any one of various storage devices, such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various kinds of package types, such as, for example, a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a controller 200. The control unit 200 may drive an instruction or an algorithm of a code type, that is, a software, and may analyze and process a request inputted from the host device. The controller 200 may control a nonvolatile memory device 300 to process a request from the host device. The controller 200 may generate control signals for controlling the operation of the nonvolatile memory device 300, for example, commands, addresses, control clock signals and so forth, and provide the generated control signals to the nonvolatile memory device 300.

The data storage device 100 may include the nonvolatile memory device 300. The nonvolatile memory device 300 may operate as the storage medium of the data storage device 100. The nonvolatile memory device 300 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide. The ferroelectric random access memory (FRAM), the magnetic random access memory (MRAM), the phase change random access memory (PCRAM) and the resistive random access memory (RERAM) are a kind of nonvolatile random access memory devices capable of random access to memory cells. The nonvolatile memory device 300 may be configured by a combination of a NAND flash memory device and the above-described various types of nonvolatile random access memory devices. In the following descriptions, the nonvolatile memory device 300 which is configured by a NAND flash memory device will be exemplified.

The nonvolatile memory device 300 may include a memory cell region 310, a control logic 360 and a state register 370.

From an operational viewpoint or a physical (or structural) viewpoint, the memory cells included in the memory cell region 310 may be configured into a hierarchical memory cell set or memory cell unit. For example, memory cells which are coupled to the same word line and are to be read and written (or programmed) simultaneously may be configured as a page PG. In the following descriptions, for the sake of convenience in explanation, memory cells configured as a page PG will be referred to as a "page." Also, memory cells to be erased simultaneously may be configured into a memory block BLK.

For illustration purposes only and not in any way limiting the invention, a memory cell region 310 which is configured by one memory block BLK will be exemplified. The memory block BLK will be exemplified to include memory cells which are arranged at areas where 4 word lines WL1 to WL4 and 2 bit lines BL1 and BL2 intersect with each other. As described above, memory cells coupled to the same word lines may be configured as pages PG1 to PG4. The number of memory blocks which configure the memory cell region 310 and the number of pages which are included in each memory block may be changed variously by design.

The control logic 360 may control general operations of the nonvolatile memory device 300, according to a request from the controller 200. For example, the control logic 360 may control operations such as read, write and erase operations according to control signals provided from the controller 200.

The state register 370 may store a state information of the nonvolatile memory device 300. The state information stored in the state register 370 may be provided to the controller 200 according to a request of the controller 200 such as a state read command.

The state information may include a result of an operation performed by the nonvolatile memory device 300 according to the request of the controller 200. For instance, the state information may include a pass/fail information on whether the performed operation has passed or failed. In the case where a write operation is requested, the state information may include an overwrite information indicating whether or not the write operation has caused an overwrite.

When the write operation causes the overwrite, the overwrite information included in the state information may be provided to the controller 200. The controller 200 may perform an exceptional processing operation based on the overwrite information.

Figure 2:
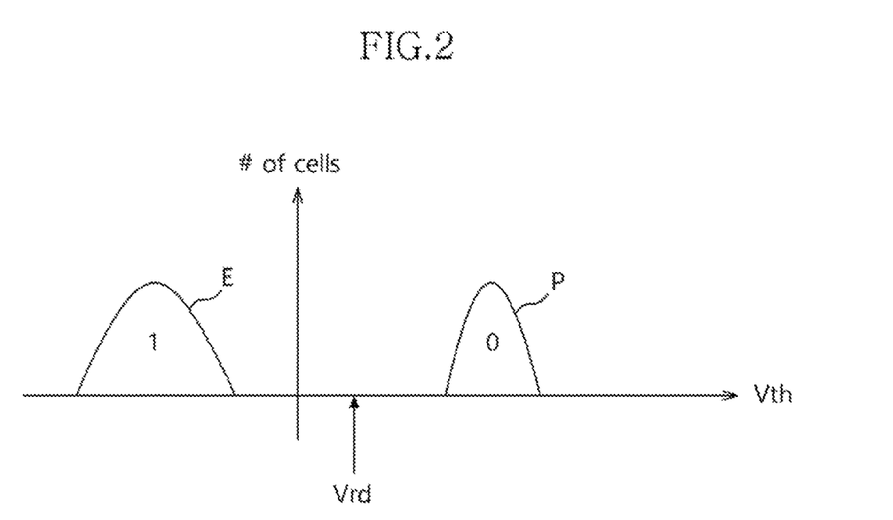
FIG. 2 is a diagram illustrating threshold voltage distributions of memory cells according to the embodiment of the present invention

FIG. 2 is a diagram illustrating threshold voltage distributions of memory cells according to an embodiment of the present invention. In the case where the memory cells included in the memory cell region 310 of FIG. 1 are configured in a single level cell (SLC) type, as shown in FIG. 2, the memory cells may be erased to have threshold voltages of a first erased state E, and may be written to have threshold voltages of a second programmed state P.

In a read operation, a read voltage Vrd having a voltage level between the first and second states E and P may be applied to the memory cells. If the read voltage Vrd is applied, a memory cell having a threshold voltage of the first state E may be discriminated as an on cell which stores data "1," and a memory cell having a threshold voltage of the second state P may be discriminated as an off cell which stores data "0."

In a write operation, in order to determine whether the write operation for memory cells is completed, a verify voltage Vvf having a voltage level higher than the read voltage Vrd may be applied to the memory cells. If the verify voltage Vvf is applied, a memory cell which has a threshold voltage lower than the verify voltage Vvf may be discriminated as an on cell which stores data "1," that is, a memory cell for which the write operation is not completed, and a memory cell which has a threshold voltage higher than the verify voltage Vvf may be discriminated as an off cell which stores data "0," that is, a memory cell for which the write operation is completed.

For writing data in a memory cell which is already written with data, an erase operation should be performed in advance. This is referred to as an erase-before-write operation. For example, referring to FIG. 2, in order to re-write data in an already programmed memory cell having a threshold voltage of the second state P (that is, a memory cell for which a write operation is completed), the threshold voltage of the memory cell should be returned to the first state E. An operation of writing data in a memory cell which is already written with data may be referred to hereinafter as an overwrite operation.

Although the nonvolatile memory device 300 is capable of an overwrite operation, the controller 200 may not request the overwrite operation to improve reliability of data. That is to say, the controller 200 may not request a write operation for a previously write-requested physical address (for example, an address for accessing a page of the nonvolatile memory device 300).

Nevertheless, the controller 200 may request unintentionally an overwrite operation by an erroneous address mapping information. The nonvolatile memory device 300 may process an overwrite operation even though the overwrite operation is unintentionally requested, and may provide a result of processing the overwrite operation to the controller 200 by using the state information. Operations of the nonvolatile memory device 300 in the case where an overwrite operation is requested will be described below in detail with reference to the attached drawings.

Figure 3:
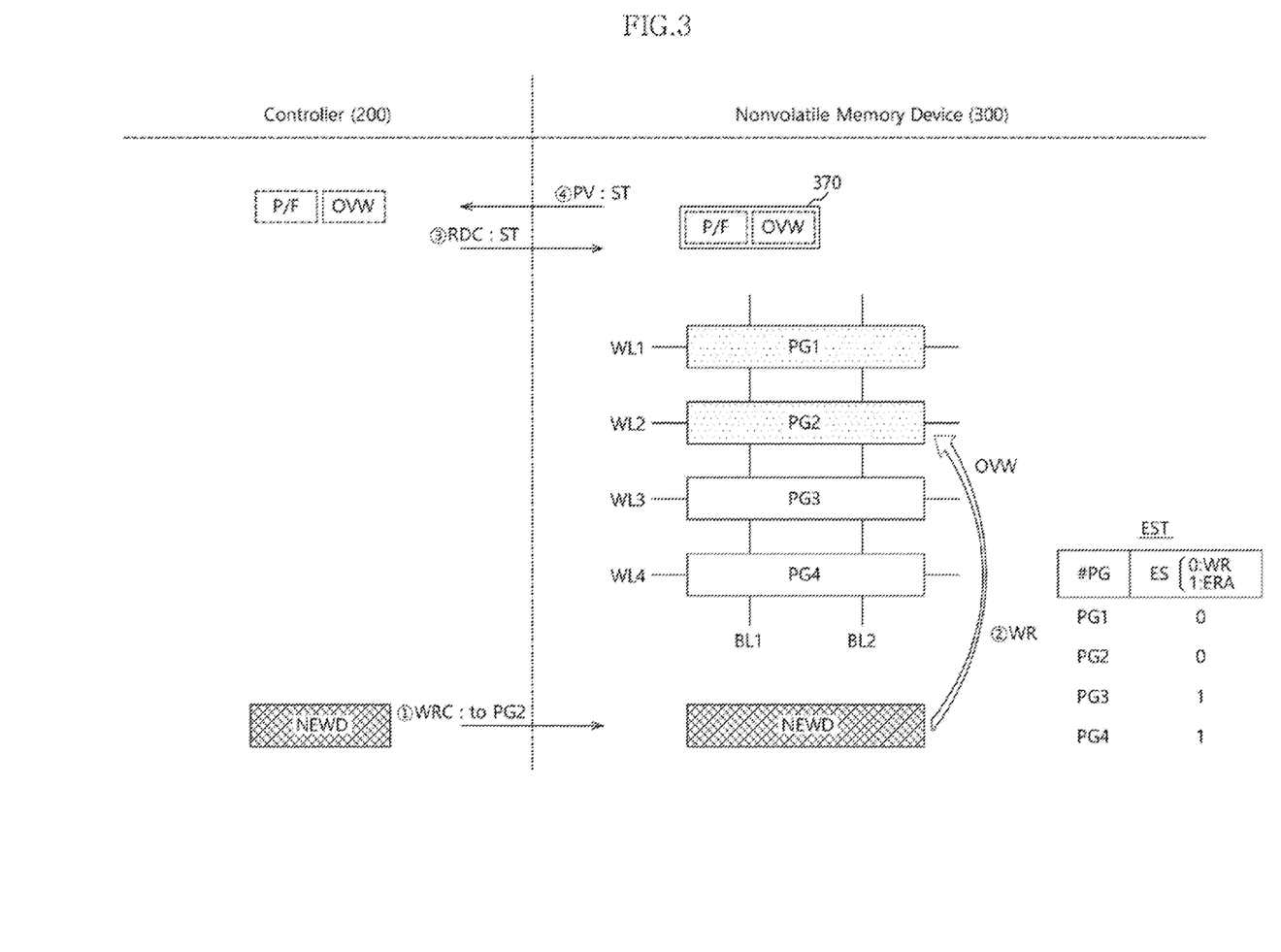
FIG. 3 is a representation of an example of a diagram to assist in the explanation of an overwrite operation of a nonvolatile memory device according to an embodiment of the present invention

FIG. 3 is a representation of an example of a diagram to assist in the explanation of an overwrite operation of a nonvolatile memory device, according to an embodiment of the present invention. For purposes of explanation only, FIG. 3 conceptually shows a request of the controller 200, that is, a control operation for the nonvolatile memory device 300, and an operation of the nonvolatile memory device 300 according to control of the controller 200. The control operation of the controller 200 may be performed by a specific operation of providing a command, an address and control signals to the nonvolatile memory device 300. Also, the operation of the nonvolatile memory device 300 may be performed by internal function blocks which operate according to a preset bias and timing conditions.

An erase state table EST shown in FIG. 3 may be managed in the nonvolatile memory device 300 and may include respective state informations of all pages. In other words, the erase state table EST may include information on whether the respective pages PG1 to PG4 are in a written state (for example, represented by a value of "0") or an erased state (for example, represented by a value of "1"). During the initialization operation of the nonvolatile memory device 300, the erase state table EST stored in a partial region of the memory cell region 310 may be loaded in a register (not shown) inside the control logic 360. Alternatively, during the initialization operation of the nonvolatile memory device 300, the erase state table EST generated by scanning state informations of the pages PG1 to PG4 from respective spare regions of the pages PG1 to PG4 may be loaded in a register (not shown) inside the control logic 360.

At a first step denoted as "① WRC" in FIG. 3, the controller 200 may control the nonvolatile memory device 300 so that new data NEWD is written in the second page PG2.

At a second step denoted as "② WR" in FIG. 3, the nonvolatile memory device 300 may perform a write operation for writing the new data NEWD according to a state of the write-requested second page PG2. Namely, the nonvolatile memory device 300 may perform the write operation for writing the new data NEWD differently depending on the state of the write-requested second page PG2 by referring to the erase state table EST.

For instance, in the case where the write-requested second page PG2 is in a written state (e.g., a state value of the second page PG2 is "0" representing the written state), the nonvolatile memory device 300 may overwrite OVW the new data NEWD in the write-requested second page PG2. Upon completion of the overwrite operation, the previously stored data in the write-requested second page PG2 may be lost.

If the write-requested second page PG2 is in an erased state (e.g., a state value of the second page PG2 is "1" representing the erase state), the nonvolatile memory device 300 may normally write the new data NEWD in the write-requested second page PG2.

At a third step denoted as "③ RDC" in FIG. 3, the controller 200 may control the nonvolatile memory device 300 so that a state information ST for a completed operation is transmitted from the controller 200 to the nonvolatile memory device 300.

At a fourth step denoted as "④ PV" in FIG. 3, the nonvolatile memory device 300 may provide the controller 200 with the state information ST stored in the state register 370.

In the case where the write operation has passed (i.e., completed successfully), the state information ST may include a pass information P meaning that the write operation has passed. In the case where the write operation has failed, the state information ST may include a fail information F meaning that the write operation has failed.

Since the overwrite is requested for the second page PG2 which is in the written state, as described with reference to the second step ("②WR"), the state information ST may include an overwrite information OVW indicating that the write operation has caused the overwrite.

For example, the nonvolatile memory device 300 may provide the controller 200 through the state information ST with an Information indicating that the write operation has caused an overwrite and whether or not the overwrite has passed or failed.

Figure 4:
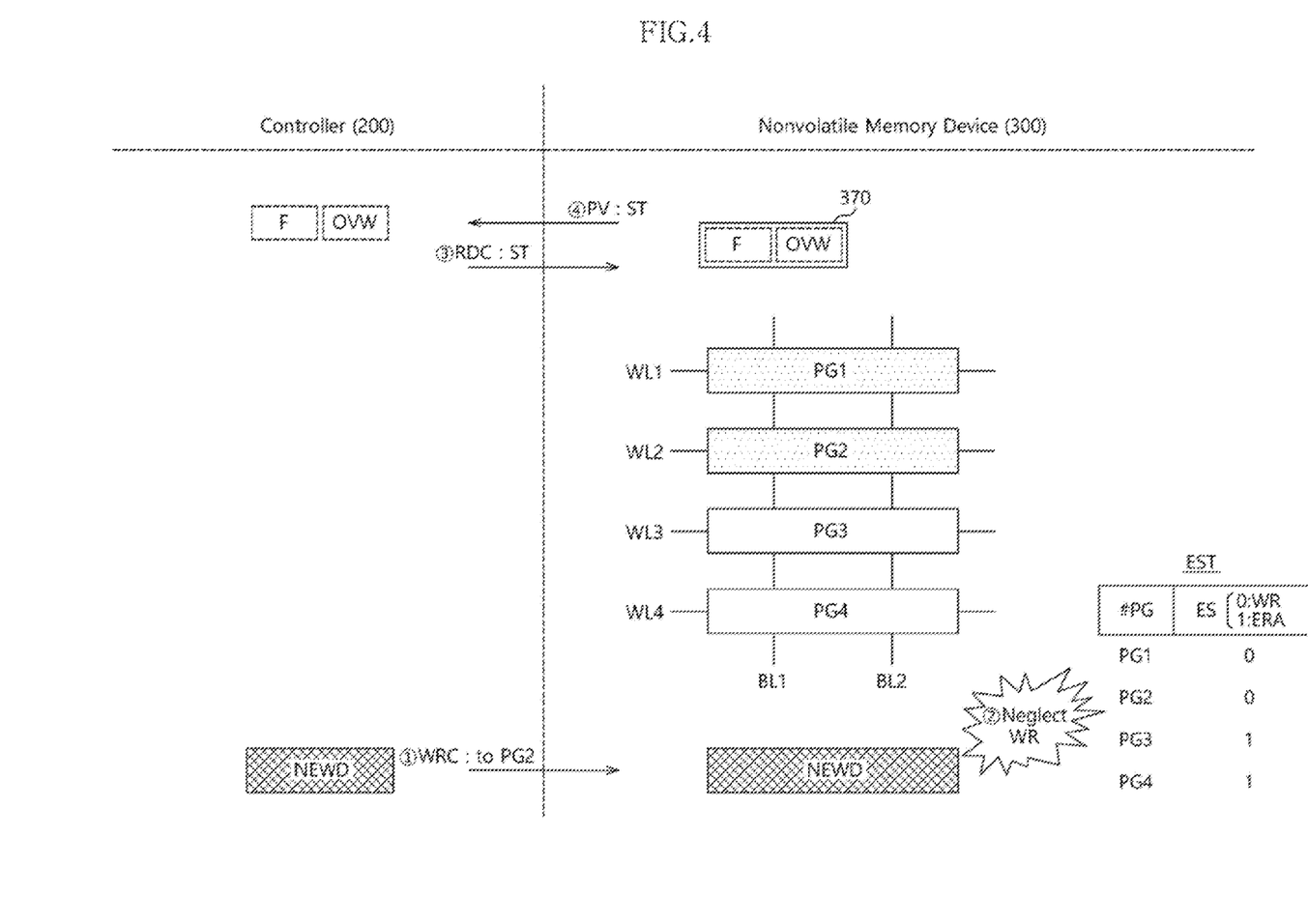
FIG. 4 is a representation of an example of another diagram to assist in the explanation of an overwrite operation of a nonvolatile memory device according to an embodiment of the present invention

FIG. 4 is another example of an overwrite operation of a nonvolatile memory device, according to an embodiment of the present invention. As an example, FIG. 4 conceptually shows a request of the controller 200, that is, a control operation for the nonvolatile memory device 300, and an operation of the nonvolatile memory device 300 according to control of the controller 200. The control operation of the controller 200 may include providing a command, an address and control signals to the nonvolatile memory device 300. Also, the operation of the nonvolatile memory device 300 may be performed by internal function blocks which operate according to a preset bias condition and a timing condition.

An erase state table EST shown in FIG. 4 may be managed in the nonvolatile memory device 300 and may include respective state informations of all pages. For example, the erase state table EST may include informations on whether the respective pages PG1 to PG4 are in a written state (for example, represented by a value of "0") or in an erased state (for example, represented by a value of "1"). During an initialization operation of the nonvolatile memory device 300, the erase state table EST stored in a partial region of the memory cell region 310 may be loaded in a register (not shown) inside the control logic 360. Alternatively, during an initialization operation of the nonvolatile memory device 300, the erase state table EST is generated by scanning state informations of the pages PG1 to PG4 from respective spare regions of the pages PG1 to PG4 and loaded in a register (not shown) inside the control logic 360.

At a first step denoted as "①WRC" in FIG. 4, the controller 200 may control the nonvolatile memory device 300 so that new data NEWD is written in the second page PG2.

At a second step denoted as "②WR" in FIG. 4, the nonvolatile memory device 300 may perform a write operation for writing the new data NEWD according to a state of the write-requested second page PG2. Namely, the nonvolatile memory device 300 may perform the write operation for writing the new data NEWD differently dependent upon the state of the write-requested page which is determined by referring to the erase state table EST.

For instance, in the case where the write-requested second page PG2 is in a written state (e.g., the second page has a state value of "0" representing the write state), the nonvolatile memory device 300 may skip the write operation for the new data NEWD. That is to say, in order to preserve previously stored data in the write-requested second page PG2, the nonvolatile memory device 300 may skip the write operation for storing the new data NEWD in the write-requested second page PG2.

If the write-requested second page PG2 is in an erased state (e.g., a state value of the second page PG2 is "1" representing the erase state), the nonvolatile memory device 300 may normally write the new data NEWD in the write-requested second page PG2.

At a third step denoted as "③RDC" in FIG. 4, the controller 200 may control the nonvolatile memory device 300 so that a state information ST for a completed operation is transmitted from the controller 200 to the nonvolatile memory device 300.

At a fourth step denoted as "④PV" in FIG. 4, the nonvolatile memory device 300 may provide the controller 200 with the state information ST stored in the state register 370.

In the case where the write operation has passed, the state information ST may include a pass information P meaning that the write operation has passed. In the case where the write operation has failed, the state information ST may include a fall information F meaning that the write operation has failed.

Since the overwrite requested for the second page PG2, which is in the written state, is not performed, as described with reference to the second step ("②WR"), the state information ST may include an overwrite information OVW meaning that the write operation has caused an overwrite and a fail information F meaning that the overwrite has failed.

That is to say, the nonvolatile memory device 300 may provide the controller 200 through the state information ST with an information indicating that the write operation has caused an overwrite and therefore the write operation has been ended as a fail.

Figure 5:
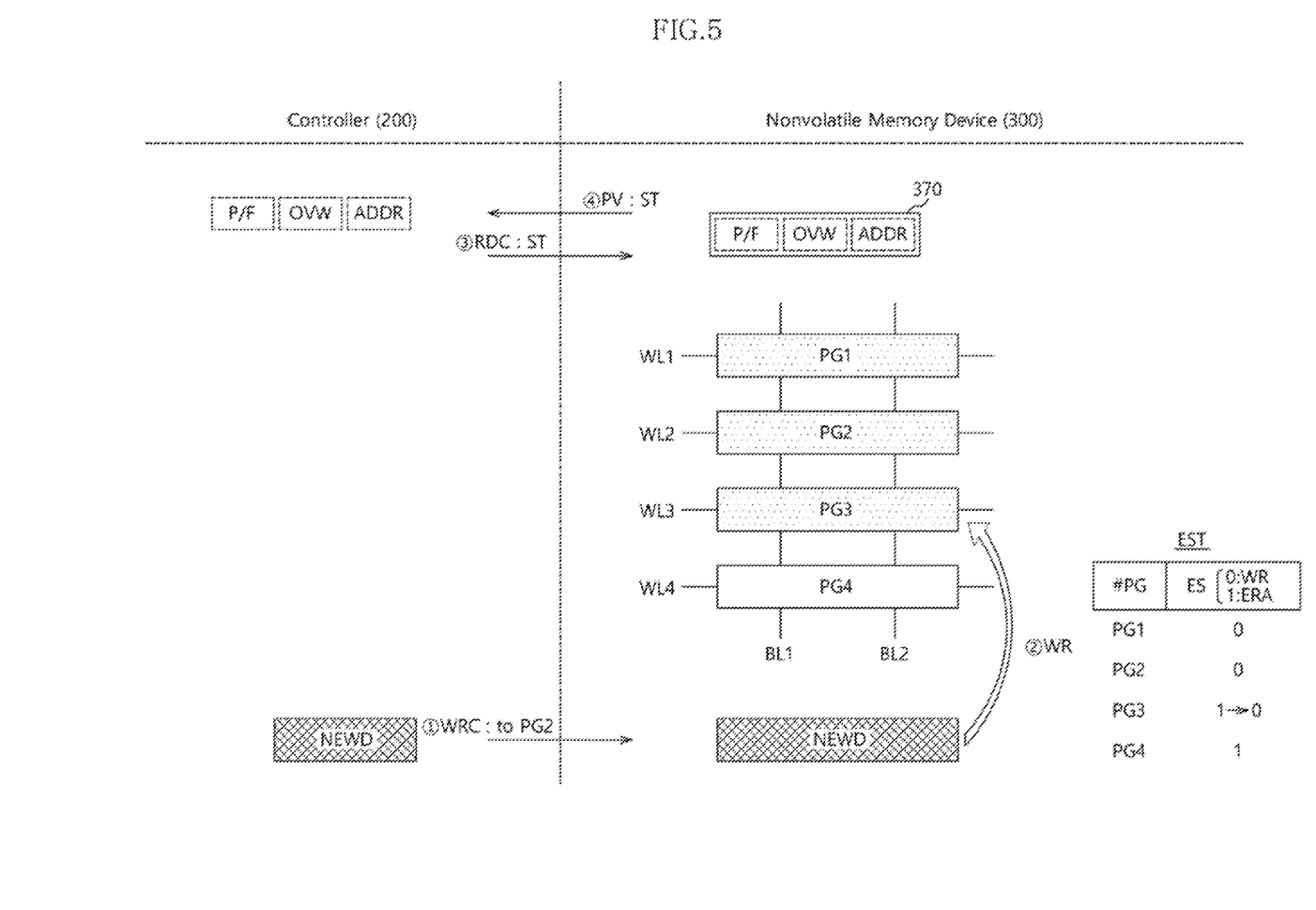
FIG. 5 is a representation of an example of another diagram to assist in the explanation of an overwrite operation of a nonvolatile memory device according to an embodiment of the present invention

FIG. 5 is another example of an overwrite operation of a nonvolatile memory device, according to an embodiment of the present invention. As an example, FIG. 5 conceptually shows a request of the controller 200, that is, a control operation for the nonvolatile memory device 300, and an operation of the nonvolatile memory device 300 according to control of the controller 200. The control operation of the controller 200 may include providing a command, an address and control signals to the nonvolatile memory device 300. Also, the operation of the nonvolatile memory device 300 may be performed by internal function blocks which operate according to a preset bias condition and a timing condition.

An erase state table EST shown in FIG. 5 may be managed in the nonvolatile memory device 300 and may include respective state informations of all pages. In other words, the erase state table EST may include informations on whether the respective pages PG1 to PG4 are in a written state (for example, represented by a value of "0") or in an erased state (for example, represented by a value of "1"). During an initialization operation of the nonvolatile memory device 300, the erase state table EST stored in a partial region of the memory cell region 310 may be loaded in a register (not shown) inside the control logic 360. Alternatively, during an initialization operation of the nonvolatile memory device 300, the erase state table EST is generated by scanning state informations of the pages PG1 to PG4 from respective spare regions of the pages PG1 to PG4 and loaded in a register (not shown) inside the control logic 360.

At a first step denoted as ". WRC" in FIG. 5, the controller 200 may control the nonvolatile memory device 300 so that new data NEWD is written in the second page PG2.

At a second step denoted as "②WR" in FIG. 5, the nonvolatile memory device 300 may perform a write operation for writing the new data NEWD according to a state of the write-requested second page PG2. Namely, the nonvolatile memory device 300 may perform the write operation for writing the new data NEWD differently dependent upon the state of the write-requested page which is determined by referring to the erase state table EST.

For instance, in the case where the write-requested second page PG2 is in a written state (e.g., the second page has a state value of "0" representing the write state), the nonvolatile memory device 300 may write the new data NEWD in a page other than the write-requested second page PG2, for example, the third page PG3. That is to say, in order to preserve previously stored data in the write-requested second page PG2, the nonvolatile memory device 300 may not overwrite the new data NEWD in the write-requested second page PG2 and instead may write the new data NEWD in another page which is in an erased state, for example, the third page PG3. Despite the overwrite operation, the previously stored data in the write-requested second page PG2 may not be lost.

The nonvolatile memory device 300 may update the state information of the third page PG3 after the overwrite of writing the new data NEWD in the third page PG3 which is in an erased state.

If the write-requested second page PG2 is in an erased state (e.g., a state value of the second page PG2 is "1" representing the erase state), the nonvolatile memory device 300 may normally write the new data NEWD in the write-requested second page PG2.

At a third step denoted as "③ RDC" in FIG. 5, the controller 200 may control the nonvolatile memory device 300 so that a state information ST for a completed operation is transmitted from the controller 200 to the nonvolatile memory device 300.

At a fourth step denoted as "④ PV" in FIG. 5, the nonvolatile memory device 300 may provide the controller 200 with the state information ST stored in the state register 370.

In the case where the write operation has passed, the state information ST may include a pass information P indicating that the write operation has passed. In the case where the write operation has failed, the state information ST may include a fail information F indicating that the write operation has failed.

Since the overwrite is requested for the second page PG2 which is in the written state, as described with reference to the second step ("② WR"), the state information ST may include an overwrite information OVW indicating that the write operation has caused the overwrite.

That is to say, the nonvolatile memory device 300 may provide the controller 200 through the state information ST with an information indicating that the write operation has caused an overwrite and another write operation instead of the overwrite to another page of an erased state instead of the overwrite-requested page of a write state has passed or failed.

Because the new data NEWD has been stored in a page other than the write-requested second page PG2, the state information ST may include an information ADDR for an address in which the new data NEWD is stored. For instance, the address information ADDR included in the state information ST may denote the address of the page PG3 in which the new data NEWD is stored. For another instance, the address information ADDR included in the state information ST may include an information on correlation between the write-requested page PG2 and the page PG3 in which the new data NEWD is actually stored, for example, a page offset information. The page offset information as a value for calculating the address of the page PG3 in which the new data NEWD is actually stored may be or include a variation or an increment/decrement from the address of the write-requested page PG2.

Figure 6:
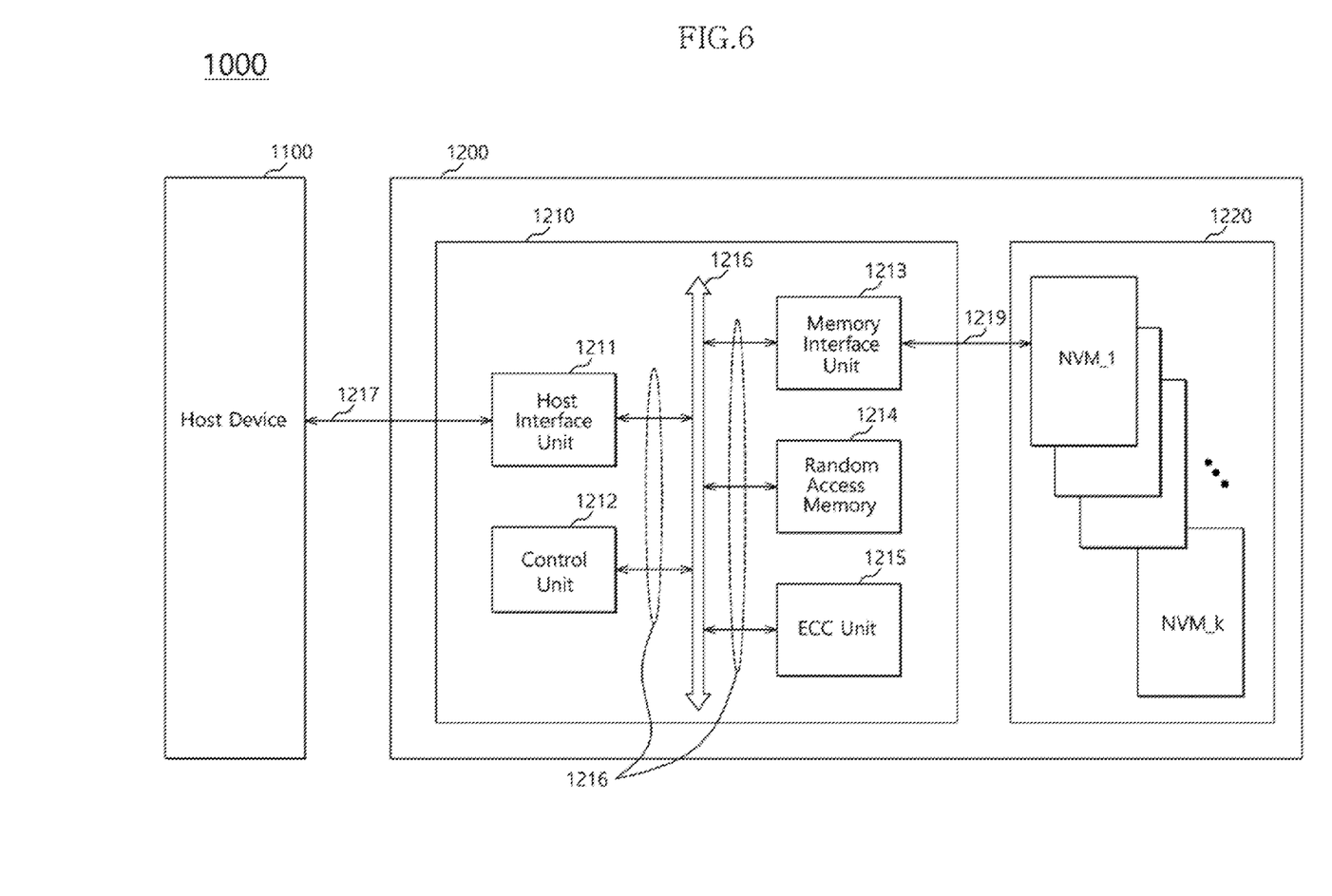
FIG. 6 is a block diagram illustrating a data processing system including a data storage device, according to an embodiment of the present invention

Referring now to FIG. 6 a data processing system including a data storage device is provided, according to an embodiment of the present invention. According to the embodiment of FIG. 6, a data processing system 1000 may include a host device 1100 and a data storage device 1200.

The data storage device 1200 may include a controller 1210 and a nonvolatile memory device 1220. The data storage device 1200 may be used by being coupled to the host device 1100 via a communication channel indicated by two way arrow 1217. The host device 1100 may be, for example a mobile phone, an MP3 player, a laptop computer, a desktop computer, a game player, a TV, an in-vehicle infotainment system, and the like. The data storage device 1200 is also referred to as a memory system.

The controller 1210 may include a host interface unit 1211, a control unit 1212, a memory interface unit 1213, a random access memory 1214, and an error correction code (ECC) unit 1215 operatively coupled to one another via a plurality of communication channels 1216 and a system bus 1218.

The control unit 1212 may control general operations of the controller 1210 in response to a request from the host device 1100. The control unit 1212 may drive a firmware and/or a software for controlling the nonvolatile memory device 1220.

The random access memory 1214 may be used as the working memory of the control unit 1212. The random access memory 1214 may be used as a buffer memory which temporarily stores data read out from the nonvolatile memory device 1220 or data provided from the host device 1100.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, and a serial attached SCSI (SAS) protocol.

The memory interface unit 1213 may interface the controller 1210 and the nonvolatile memory device 1220 via a communication channel 1219. The memory interface unit 1213 may provide a command and an address to the nonvolatile memory device 1220. Furthermore, the memory interface unit 1213 may exchange data with the nonvolatile memory device 1220. Any suitable memory interface may be employed.

The error correction code (ECC) unit 1215 may ECC-encode data to be stored in the nonvolatile memory device 1220. Also, the ECC unit 1215 may ECC-decode data read out from the nonvolatile memory device 1220. Any suitable ECC unit may be employed.

The nonvolatile memory device 1220 may be used as the storage medium of the data storage device 1200. The nonvolatile memory device 1220 may include a plurality of nonvolatile memory chips (or dies) NVM_1 to NVM_k.

The nonvolatile memory device 1220 may provide, as described above with reference to FIGS. 3 to 5, a state information including an overwrite information, according to a request from the controller 1210.

The controller 1210 and the nonvolatile memory device 1220 may be manufactured as any one of various data storage devices. For example, the controller 1210 and the nonvolatile memory device 1220 may be integrated into a single semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a Personal Computer Memory Card International Association (PCMCIA) card, a compact flash (CF) card, a smart media card, a memory stick, and so forth.

Figure 7:
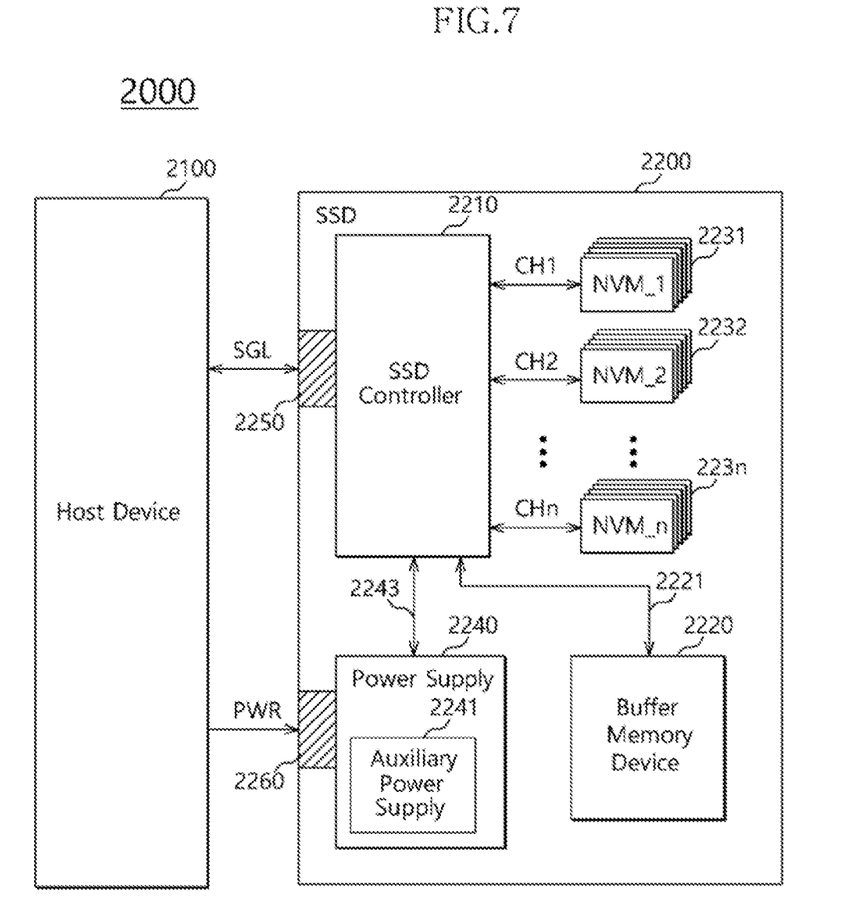
FIG. 7 is a block diagram illustrating a data processing system including a solid state drive (SSD), according to an embodiment of the present invention

FIG. 7 is a block diagram illustrating a data processing system including a solid state drive (SSD), according to an embodiment of the present invention. According to the embodiment of FIG. 7, a data processing system 2000 may include a host device 2100 and a solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100 via a plurality of channels CH1 to CHn.

The SSD controller 2210 may access the buffer memory device 2220 via a communication channel 2221.

The buffer memory device 2220 may temporarily store data to be stored in the nonvolatile memory devices 2231 to 223n. Further, the buffer memory device 2220 may temporarily store data read out from the nonvolatile memory devices 2231 to 223n. The data temporarily stored in the buffer memory device 2220 may be transmitted to the host device 2100 or the nonvolatile memory devices 2231 to 223n under control of the SSD controller 2210.

The nonvolatile memory devices 2231 to 223n may be used as storage media of the SSD 2200. The nonvolatile memory devices 2231 to 223n may be coupled with the SSD controller 2210 through a plurality of channels CH1 to CHn, respectively. One or more nonvolatile memory devices may be coupled to each channel. The nonvolatile memory devices coupled to each channel may be coupled to the same signal bus and data bus.

Each of the nonvolatile memory devices 2231 to 223n may provide, as described above with reference to FIGS. 3 to 5, a state information including an overwrite information, according to a request from the SSD controller 2210.

The power supply 2240 may provide power PWR received from the host device 2000 through the power connector 2260, to the inside of the SSD 2200 via at least one internal power link 2243. The power supply 2240 may include an auxiliary power supply 2241. The auxiliary power supply 2241 may supply power to allow the SSD 2200 to be normally terminated when a sudden power-off occurs. The auxiliary power supply 2241 may include large capacitance capacitors capable of charging power PWR received from the host.

The SSD controller 2210 may exchange a signal SGL with the host device 2100 through the signal connector 2250. The signal SGL may include a command, an address, data, and so forth. The signal connector 2250 may by configured by a connector such as, for example, a parallel advanced technology attachment (PATA), serial advanced technology attachment (SATA), small computer system interface (SCSI), serial attached SCSI (SAS), peripheral component interconnection (PCI) and PCI express (PCI-E) protocols, according to an interface scheme between the host device 2100 and the SSD 2200.

Figure 8:
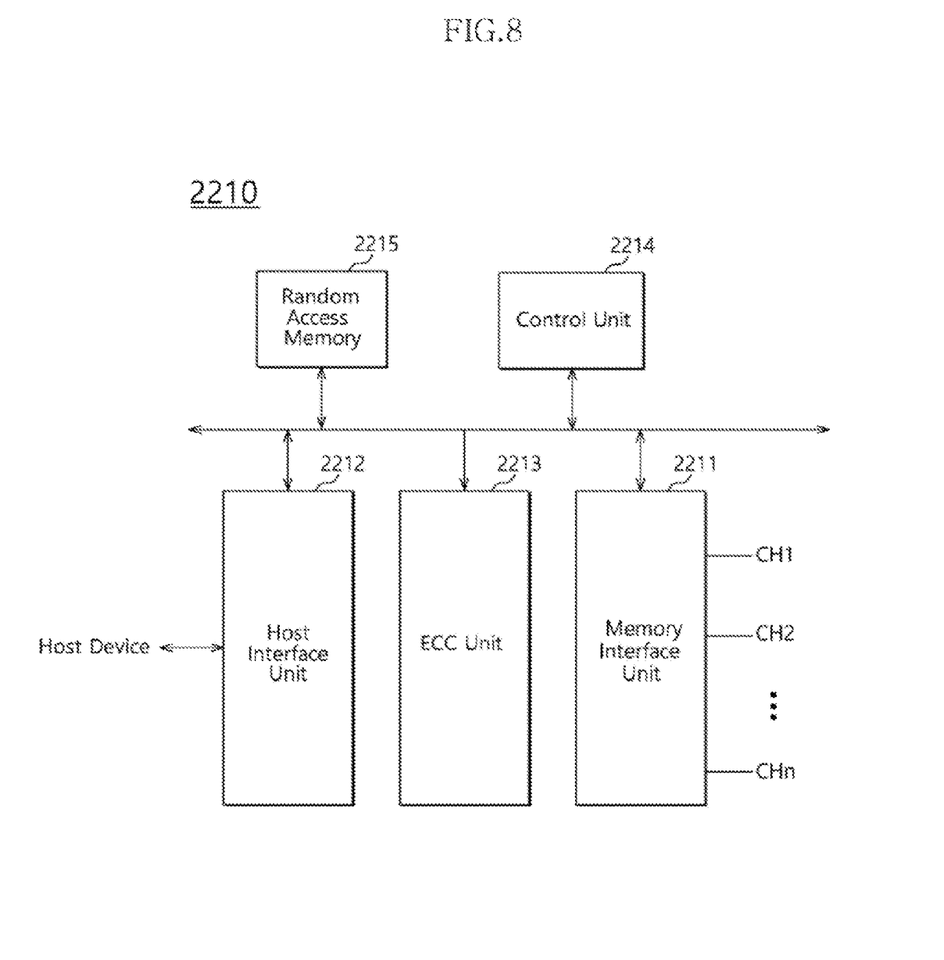
FIG. 8 is a block diagram illustrating an example of the SSD controller shown in FIG. 7.

FIG. 8 illustrates an example of the SSD controller of FIG. 7. Referring to FIG. 8, the SSD controller 2210 may include a memory interface unit 2211, a host Interface unit 2212, an error correction code (ECC) unit 2213, a control unit 2214, and a random access memory 2215.

The memory interface unit 2211 may provide control signals such as commands and addresses to the nonvolatile memory devices 2231 to 223n. Moreover, the memory interface unit 2211 may exchange data with the nonvolatile memory devices 2231 to 223n. The memory interface unit 2211 may scatter data transmitted from the buffer memory device 2220 to the respective channels CH1 to CHn, under control of the control unit 2214. Furthermore, the memory interface unit 2211 may transmit data read out from the nonvolatile memory devices 2231 to 223n to the buffer memory device 2220, under control of the control unit 2214.

The host interface unit 2212 may provide interfacing with respect to the SSD 2200 in correspondence to the protocol of the host device 2100. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI) and PCI express (PCI-E) protocols. In addition, the host interface unit 2212 may perform a disk emulating function of supporting the host device 2100 to recognize the SSD 2200 as a hard disk drive (HDD).

The control unit 2214 may analyze and process the signal SGL inputted from the host device 2100. The control unit 2214 may control operations of the buffer memory device 2220 and the nonvolatile memory devices 2231 to 223n according to a firmware or a software for driving the SSD 2200. The random access memory 2215 may be used as a working memory for driving the firmware or the software.

The error correction code (ECC) unit 2213 may generate parity data to be transmitted to the nonvolatile memory devices 2231 to 223n, among data stored in the buffer memory device 2220. The generated parity data may be stored, along with data, in the nonvolatile memory devices 2231 to 223n. The error correction code (ECC) unit 2213 may detect an error of the data read out from the nonvolatile memory devices 2231 to 223n. When the detected error is within a correctable range, the error correction code (ECC) unit 2213 may correct the detected error.

Figure 9:
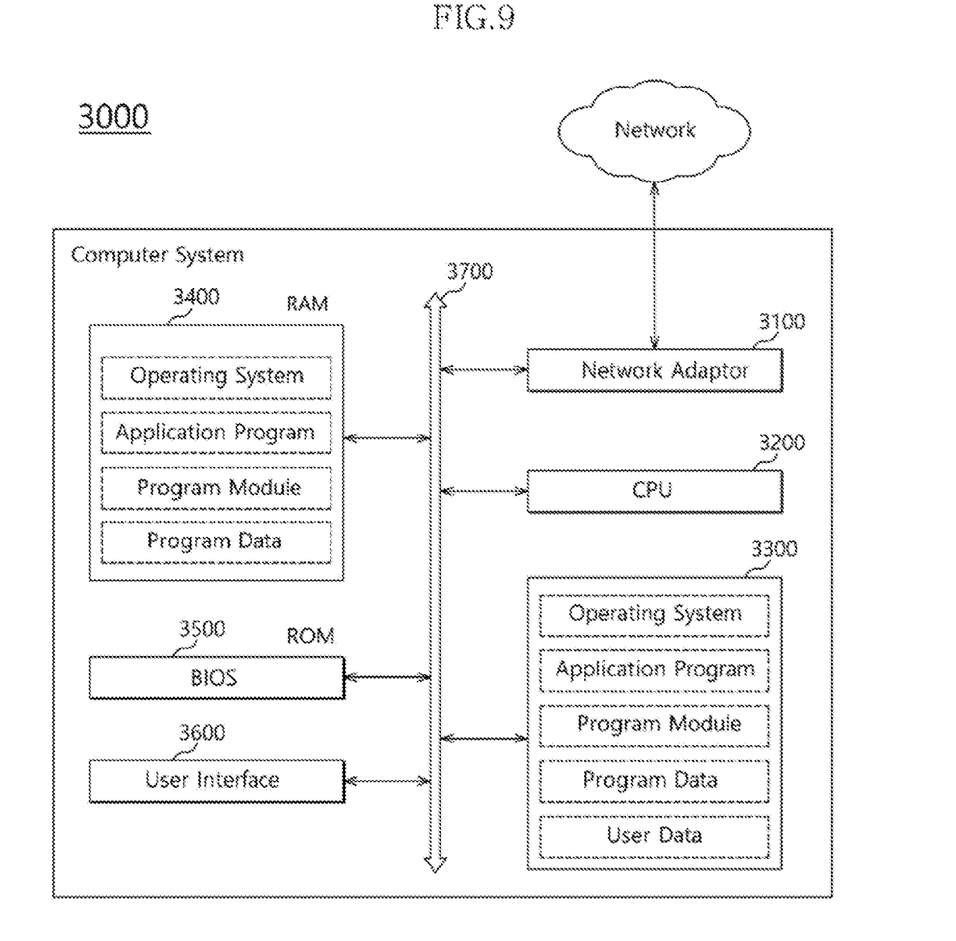
FIG. 9 is a block diagram illustrating a computer system including a data storage device, according to the embodiment of the present invention.

FIG. 9 is a block diagram illustrating a computer system to which the data storage device is mounted, according to an embodiment of the present invention. According to the embodiment of FIG. 9, a computer system 3000 includes a network adaptor 3100, a central processing unit 3200, a data storage device 3300, a RAM 3400, a ROM 3500 and a user interface 3600, which are electrically coupled to a system bus 3700. The data storage device 3300 may be configured by the data storage device 100 shown in FIG. 1, the data storage device 1200 shown in FIG. 6 or the SSD 2200 shown in FIG. 7.

The network adaptor 3100 may provide interfacing between the computer system 3000 and external networks. The central processing unit 3200 may perform general calculation processing for driving an operating system residing at the RAM 3400 or an application program.

The data storage device 3300 may store general data needed in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data needed for driving programs, which are read out from the data storage device 3300, may be loaded on the RAM 3400. A BIOS (basic input/output system) which is activated before the operating system is driven may be stored in the ROM 3500. Information exchange between the computer system 3000 and a user may be implemented through the user interface 3600.

Figure 10:
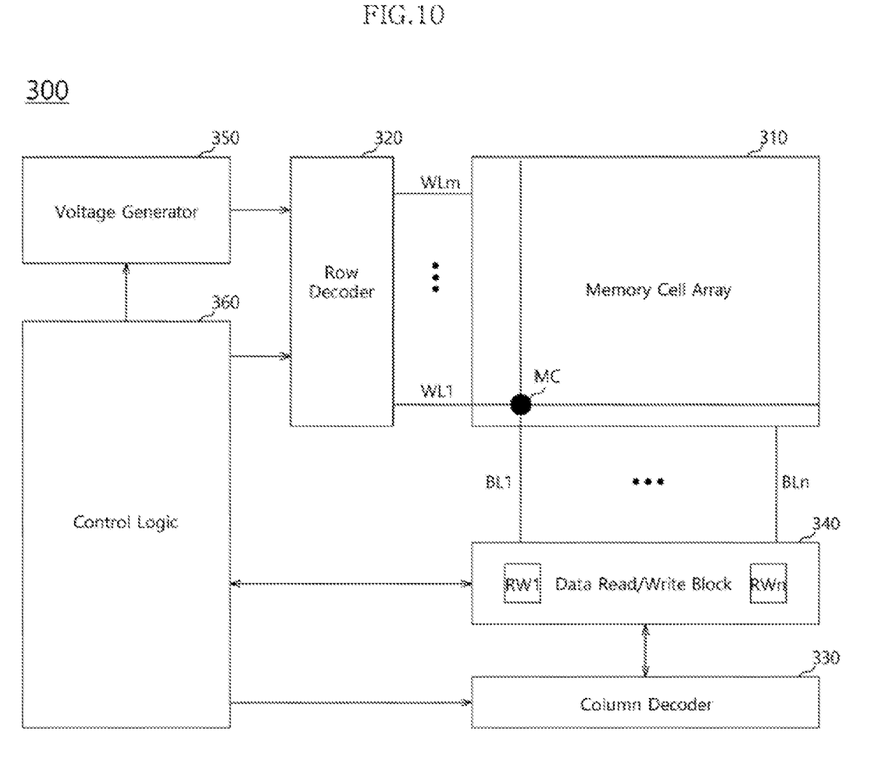
FIG. 10 is a block diagram illustrating an example of a nonvolatile memory device included in the data storage device, according to the embodiment of the present invention.

FIG. 10 is a block diagram illustrating a nonvolatile memory device included in a data storage device, according to an embodiment of the present invention. According to the embodiment of FIG. 10, a nonvolatile memory device 300 may include a memory cell array 310, a row decoder 320, a column decoder 330, a data read/write block 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 340 may be coupled with the memory cell array 310 through the bit lines BL1 to BLn. The data read/write block 340 may include read/write circuits RW1 to RWn respectively corresponding to the bit lines BL1 to BLn. The data read/write block 340 may operate according to control of the control logic 360. The data read/write block 340 may operate as a write driver or a sense amplifier according to an operation mode. For example, the data read/write block 340 may operate as a write driver which stores data provided from the external device, in the memory cell array 310 in a write operation. For another example, the data read/write block 340 may operate as a sense amplifier which reads out data from the memory cell array 310 in a read operation.

The column decoder 330 may operate under the supervisory control of the control logic 360. The column decoder 330 may decode an address provided from the external device. The column decoder 330 may couple the read/write circuits RW1 to RWn of the data read/write block 340 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control the general operations of the nonvolatile memory device 300, based on control signals provided from the external device. For example, the control logic 360 may control operations of the nonvolatile memory device 300 such as read, write and erase operations of the nonvolatile memory device 300. While not shown, the control logic 360 may include a state register for storing a state information. The control logic 360 may provide a state information including an overwrite information, according to a request from an external device.

While various embodiments have been described above, it will be understood to those skilled in the art that the embodiments described are examples only. Accordingly, the data storage device and the operating method thereof described herein should not be limited based on the described embodiments.

It will be apparent to those skilled in the art that various changes and modifications may be made without departing from the spirit and scope of the invention as defined in the following claims.

What is claimed is:

1. A data storage device comprising:
a nonvolatile memory device including plural pages; and
a controller suitable for controlling the nonvolatile memory device to store data in a part of the plural pages in response to a write request for a first page,
wherein the nonvolatile memory device provides the controller with a state information including an overwrite information representing whether an overwrite is caused due to the write request for the first page which is in a written state.

2. The data storage device according to claim 1, wherein the nonvolatile memory device overwrites the data in the first page.

3. The data storage device according to claim 1, wherein the nonvolatile memory device omits a write operation for the data.

4. The data storage device according to claim 1, wherein the nonvolatile memory device performs a write operation to a second page other than the first page.

5. The data storage device according to claim 4, wherein the state information further includes an information on an address of the second page.

6. The data storage device according to claim 1, wherein the state information further includes a pass/fail information meaning whether the write operation has passed or failed.

7. The data storage device according to claim 1, the nonvolatile memory device further generates the overwrite information for the first page by referring to an erase state table for managing whether the first page is a written state or an erased state.

8. A method for operating a data storage device including a controller and a nonvolatile memory device having a plurality of pages,
controlling, at the controller, the nonvolatile memory device to store data in a part of the plurality of pages in response to a write request for a first page; and
providing, at the nonvolatile memory controller, the controller with a state information including an overwrite information representing whether an overwrite is caused due to the write request for the first page which is in a written state.

9. The method according to claim 8, further comprising performing, at the nonvolatile memory controller, an overwrite operation to the first page.

10. The method according to claim 8, further comprising omitting, at the nonvolatile memory controller, a write operation for the data.

11. The method according to claim 8, further comprising performing, at the nonvolatile memory controller, a write operation to a second page other than the first page.

12. The method according to claim 11, wherein the state information further includes an information on an address of the second page.

13. The method according to claim 8, wherein the state information further includes a pass/fail information meaning whether the write operation has passed or failed.

14. The method according to claim 8, further comprising generating the overwrite information for the first page by referring to an erase state table for managing whether the first page is a written state or an erased state.

* * * * *

UNITED STATES PATENT AND TRADEMARK OFFICE
CERTIFICATE OF CORRECTION

PATENT NO. : 9,837,166 B2  
APPLICATION NO. : 15/186216  
DATED : December 5, 2017  
INVENTOR(S) : Hyun Jun Kim et al.

It is certified that error appears in the above-identified patent and that said Letters Patent is hereby corrected as shown below:

Change the Inventors section as follows:

(72) Inventors: Hyun Jun Kim, Gyeonggi-do (KR);  
Byeong Gyu Park, Gyeonggi-do (KR);

Signed and Sealed this  
Ninth Day of January, 2018

Joseph Matal  
*Performing the Functions and Duties of the*  
*Under Secretary of Commerce for Intellectual Property and*  
*Director of the United States Patent and Trademark Office*